US006981318B2

(12) United States Patent
Wong

(10) Patent No.: US 6,981,318 B2
(45) Date of Patent: Jan. 3, 2006

(54) PRINTED CIRCUIT BOARD MANUFACTURING METHOD

(75) Inventor: Sul Kay Wong, North Point (HK)

(73) Assignee: Jetta Company Limited, Fanling (CN)

( * ) Notice: Subject to any disclaimer, the term of this patent is extended or adjusted under 35 U.S.C. 154(b) by 275 days.

(21) Appl. No.: 10/278,740

(22) Filed: Oct. 22, 2002

(65) Prior Publication Data

US 2004/0078968 A1    Apr. 29, 2004

(51) Int. Cl.
H05K 3/02    (2006.01)
(52) U.S. Cl. .......................... 29/846; 29/831; 29/852; 174/260
(58) Field of Classification Search .................. 29/846, 29/831, 852; 174/259, 260; 216/18
See application file for complete search history.

(56) References Cited

U.S. PATENT DOCUMENTS

| 3,567,544 | A |   | 3/1971  | Wells                       |
|-----------|---|---|---------|-----------------------------|
| 3,600,330 | A |   | 8/1971  | Schreble                    |
| 3,674,658 | A |   | 7/1972  | Vanasperen                  |
| 4,371,459 | A |   | 2/1983  | Nazarenko                   |
| 4,411,982 | A | * | 10/1983 | Shibuya et al. ....... 430/314 |
| 4,517,227 | A |   | 5/1985  | Cassat                      |
| 4,668,533 | A |   | 5/1987  | Miller                      |
| 4,756,756 | A |   | 7/1988  | Cassat                      |
| 4,982,495 | A | * | 1/1991  | Okamoto et al. .......... 29/846 |
| 5,017,742 | A |   | 5/1991  | Bladon                      |
| 5,108,785 | A | * | 4/1992  | Lincoln et al. .......... 427/555 |
| 5,184,111 | A | * | 2/1993  | Pichl ............... 340/572.1 |
| 5,277,787 | A |   | 1/1994  | Otani                       |
| 5,369,881 | A | * | 12/1994 | Inaba et al. ............ 29/846 |
| 5,527,999 | A | * | 6/1996  | Knigga et al. ........... 174/261 |
| 3,556,955 | A |   | 9/1996  | Vergnaud                    |
| 5,584,120 | A | * | 12/1996 | Roberts ................ 29/846 |
| 5,761,801 | A | * | 6/1998  | Gebhardt et al. ......... 29/846 |
| 6,109,175 | A | * | 8/2000  | Kinoshita ............. 101/170 |
| 6,113,771 | A |   | 9/2000  | Landau et al.               |
| 6,818,836 | B2| * | 11/2004 | Shiraishi et al. ........ 174/260 |

* cited by examiner

Primary Examiner—Carl J. Arbes
(74) Attorney, Agent, or Firm—Kevin J. McGough; Coleman, Sudol, Sapone P.C.

(57) ABSTRACT

Method for producing a printed circuit board on a substrate comprising five steps: (a) printing a predetermined circuit pattern onto the substrate using a conductive material, (b) applying additional connection traces onto the substrate, (c) depositing a metal onto the printed circuit pattern by electroplating or electroforming a metal onto the substrate, (d) applying an adhesion and insulation glue layer over portions of the metal that comprises the desired circuit pattern, and (e) removing any undesired connection traces from the substrate.

23 Claims, 1 Drawing Sheet

PRINTED CIRCUIT BOARD MANUFACTURING METHOD

FIELD OF THE INVENTION

The invention is directed to a method or process of making printed circuit boards by a print and metal electro-deposit technique.

BACKGROUND OF THE INVENTION

A variety of products contain electrical circuitry for carrying signals and/or power to perform functions such as communication, display, heating, computation, etc. Electrical circuitry can be wired by hand, but is typically embodied in what is known in the art as a printed circuit board, which is installed in the product. Conventional printed circuit boards were made from a rigid, non-conductive substrate upon which conductive pathways (e.g., metal) have been formed.

A variety of processes have been used for forming the conductive pathways on the non-conductive substrate. For example, a metal film such as copper can be applied to a rigid, semi-rigid or flexible, non-conductive substrate such as fiberglass, epoxy, and/or polyamide. In a common process, a sheet of the conductive metal is laminated to the non-conductive substrate and a photoresist is then coated on the metal sheet. The resulting printed circuit board is then exposed to a pattern of light employing a light mask to reproduce the metal pathway pattern desired. This exposure is followed by photoresist development and then metal etching in the area unprotected by the photoresist, in order to produce the desired circuit pattern. In the alternative, an etch resist can be directly printed such as by silk screen, gravure, or the like, on the metal laminate sheet followed by curing and then metal etching. Of course, this multi-step process is slow, time-consuming, relatively expensive, and contaminate to the environment.

Another process presently available uses metals or metal salts, which are dispersed as particles in a solution, usually in a polymeric binder, and the particles function as seed sites for subsequent plating with a metal. The polymeric composition containing the metal or metal salt is applied to a substrate in the pattern desired. The composition is then heat-cured in order to drive off solvent and to cross-link the polymer. The substrate is then submerged in a metal bath or solution where metal pathways grow between the seed sites. This is a multi-step process that is not only slow but also expensive. Typical examples of these processes are disclosed, for example, in U.S. Pat. Nos. 3,900,320; 3,775,176; and 3,600,330.

Electrically conductive metal pathways can also be formed by a process which includes coating a substrate with a composition containing a reducible metal complex. For example, the substrate can be coated with a sorbitol copper formate solution containing a photo-activated reducing agent. Upon exposure to ultraviolet radiation, unmasked areas are reduced to copper metal and are suitable for plating nucleation sites. Non-exposed areas are washed clean and all copper formate is removed before plating can be carried out. Again, such processes are time consuming and expensive. Examples of this technology may be found in U.S. Pat. Nos. 4,268,536; 4,181,750; 4,133,908; 4,192,764; 4,167,601; and 3,925,578.

Printed circuit boards can also be produced by silk-screen processes in which a silk screen is placed on top of a rigid substrate and ink is pushed through open areas of the silk screen onto the substrate. This is an indirect printing process because the silk screen stencil must first be placed over the substrate, a high viscosity ink is then pushed through the screen onto the substrate, and then the silk screen stencil must be removed. Several problems are associated with this process. First, the inks must be fixed so as not to flow through the screen except where pushed, yet they must be applied with sufficient quantity and thickness of ink to flow together after being applied to make a uniformly conductive surface. Next, the speed of production is very slow with only a small quantity of printed circuit boards being produced with given period of time. Finally, the precision of the circuits is quite low since pulling the stencil away from the substrate causes dispersion at the edges. Silk screen processing cannot produce thin or narrow lines because of the high viscosity ink. Also, silk screen inks are quite expensive and difficult to process. Silk screen processes cannot be used to produce multi-layer printed circuit boards, and silk screen processes can only be used with rigid substrates since a firm backing is required to push the ink through the silk screen stencil and to remove the stencil. Even if these difficulties can be overcome, silk-screening is difficult or impossible to automate fully for high speed printing.

In yet another known process, catalytic inks are applied to a substrate and are subsequently activated for plating by electroless surface treatment with noble and/or non-noble metals or salts. The coated substrates are heat-cured and require elevated temperatures and long cure times. These multi-step processes are quite expensive and time consuming. Typical examples of these processes are shown in U.S. Pat. Nos. 4,089,993; 4,073,981; 4,100,038; and 4,006,047.

Printed circuit boards may also be produced by an additive technique wherein a metal-loaded resinous ink is first printed on the board, the circuit next being covered with a conductive metal powder while the ink is still wet. The powder is then pressed into the ink and the circuit cured. Next, a solder stratum is alloyed with the powder as by a solder paste printed over the circuit and the board heated to cause the solder to alloy with the ink an powder substrates. A solder resist may then be applied selectively over the circuit and multiple layers of circuits may be built up on the board. The conductive ink is an epoxy resin loaded with a metallic powder, preferably copper, with a catalyst added to the ink. The solder paste is a lead-tin alloy containing antimony suspended in a binder and a flux. The apparatus employed to carry out the procedure includes silk screens and a roller arrangement for pressing the metallic powder into the ink. An example of this process is disclosed in U.S. Pat. No. 4,327,124.

Furthermore, U.S. Pat. Nos. 6,010,771 and 5,763,058 disclose a method of making printed circuit boards formed by a conductive liquid printed directly onto one side of the substrate. The electrical component is then capable of performing its electrical circuit functions, as printed, and without the necessity for post-printing processes such as metal etching, catalytic ink activation, or electroless deposition.

In summary, known processes for producing electrical circuitry such as silk-screen, catalytic ink, chemical etching, electroless bath, etc. are expensive, time consuming, substrate restrictive and sometimes environmentally harmful. What is needed is an efficient, environmentally friendly method for producing electrical component-bearing substrates, and especially printed circuit boards that allows a wide variety of substrates to be used, including previously unavailable inexpensive substrates, which can be performed at lower electrical currents and temperatures than the prior art.

SUMMARY OF THE INVENTION

In order to avoid the drawbacks of the prior art, a new method has been developed. The new print and metal electro-deposit method is described in general as:

1) obtaining a rigid, semi-rigid, or flexible substrate, which preferably is water resistant and is an electrical insulator, preferably temperature resistant above 150° C.;

2) printing the desired circuit pattern onto the substrate with a conductive ink or paste;

3) printing any additional connection traces or links needed to connect up the desired circuit pattern together, which will be connected to the cathode in the electro-deposition process before metal deposition;

4) depositing by an electroplating or an electroforming process any conductive metal at a thickness of about 0.001 mm to about 1 mm;

5) applying an adhesion and insulation/glue layer over the top of desired portions of the deposited metal and substrate, so that the metal trace is encapsulated and secured to the substrate;

6) removing the undesired connection traces/links from the substrate; and 7) cutting the now metal-deposited substrate to the desired shape.

Selected portions of the substrate may be left uncovered so that it may be used in further printed circuit board assembly soldering and integrated circuit chip wire bonding.

This new method can allow circuit printing on a wider variety of substrates, including inexpensive substrates which could not be employed when using prior art methods, such as resin bonded cardboard, water-resistant paper and thermoplastics such as polyester and polyethylene. Further, this method can be performed at low electrical currents (under 500 mA), low voltage (below 30 volts) and low working temperatures (below 100° C.). Additionally, the new method is thought to be more environmentally friendly than the prior art methods by eliminating the need for the photo etching process of the metal layer.

DETAILS OF THE INVENTION

Figure 1:
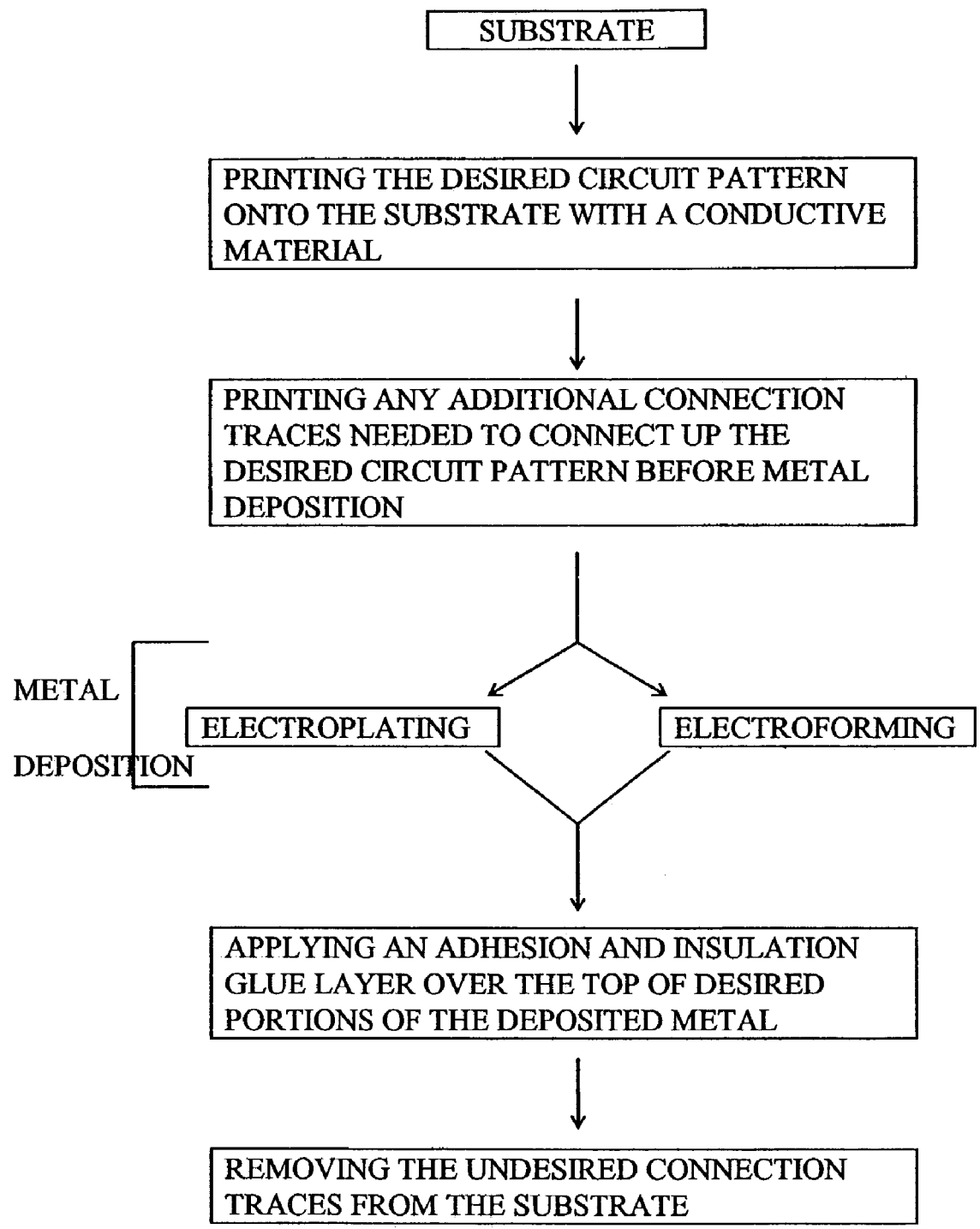
FIG. 1 is a flow diagram setting forth the steps involved in producing printed circuit boards according to the invention.

The invention is directed to a method or process of making printed circuit boards by a print and metal electro-deposit technique.

In the print and metal electro-deposit method of making printed circuit boards, the substrate can be any rigid, semi-rigid, or flexible material that is water resistant, is an electrical insulator and is temperature resistant over 150° C.

For example, the substrate can be any natural or synthetic support. The substrate can also be an active integrated circuit. The substrate can be a metal, alloy, metal oxide, alloy oxide, ceramic, glass, paper, polymer, molded polymer, filled polymer or a composite comprising one or more of the above. Preferred is a substrate material selected from the group consisting of glass, paper, ceramics, or polymers.

In the print and metal electro-deposit method, the desired circuit pattern is printed on a substrate with a conductive material. The conductive material can be an ink or a paste. Preferably the conductive material is an ink or a paste made up of a resin binder and a conductive particle, such as carbon, silver, or copper. The resin binder glues the conductive component together and adheres it onto the substrate. Preferably the conductive material is a resin bonded conductive powder, which can include carbon, silver, copper, etc.

Commercially available conductive carbon ink/paste or silver ink/paste can be used, such as E-Kote Electrically Conductive inks/paints produced by IMI Company and Electrodag® carbon ink produced by Acheson Colloids Company. For better electro-deposit results, a metal base conductive ink is preferred.

Application of the conductive material leaves a printed circuit board trace. Any additional connective traces that are needed to connect up the desired circuit pattern before metal deposition can be printed by normal printing processes such as silk screening, off-set, pad printing, etc. together with the printed circuit board trace.

The substrate printed with conductive trace will then be connected to the cathode of the electro-plating or electro-forming chemical bath, the metal ions in the electro-deposit bath are then deposited on the conductive trace or the printed circuit board pattern forming a layer of metal over the trace. Metals for use can be any conductive metal, such as copper, nickel, silver, gold, etc. The preferred metal is copper for economical, conductivity and solder-ability reasons. The metal is deposited on the conductive trace by either known electroplating or electroforming process.

Electroplating a metal on a substrate is a process comprising exposing a substrate imprinted with a circuit pattern of a conductive material to a plating bath consisting of metal ions for an amount of time and an amount of current needed to form a uniform plated thickness of metal on the imprinted portion of the substrate. In an embodiment of the invention, the electroplating process will deposit a metal layer thickness that will normally be about 0.0001 mm to about 0.001 mm.

Electroforming a metal on a substrate is a process similar to electroplating, i.e, a process comprising exposing a substrate imprinted with a circuit pattern of a conductive material to a plating bath consisting of metal ions for an amount of time and an amount of current needed to form a uniform plated thickness of metal on the substrate, except the uniform plated thickness of metal on the substrate is much thicker than in electroplating. For example, in an embodiment of the invention, the electroforming process will deposit a metal layer thickness that will normally be about 0.001 mm to about 1.0 mm.

In a preferred embodiment of electroplating or electroforming, a substrate with a printed conductive ink or paste trace will be connected to the negative pole (cathode) of an acid copper sulfate plating bath where the copper ions will deposit onto the conductive ink or paste trace up to the desired thickness. The current density will ordinarily range from 0.5 A to 5 A per square meter and the deposit time will range from 10 to 60 minutes.

Next an adhesion and insulation glue layer or self adhesive label is applied over the top of the desired portions of the deposited metal and substrate, whereby the metal trace is encapsulated and secured to the substrate. The area of the metal trace to be connected and mounted with electronic components will be left open and not encapsulated, i.e, the desired components connection area is left exposed. In an embodiment of the invention, the adhesion and insulation glue layer can be applied by silk screening or similar processes. The adhesion and insulation glue layer can be air dried or heat dried or U.V. cured. Adhesion and insulation glue or ink is a commercially available product.

After applying the adhesion and insulation glue or ink, the undesired connection traces from the substrate can be removed by die cutting or breaking open the undesired connections by cutting through it with a cutter or punching a hole through the undesired connection traces to get the final desired conductive trace of the circuitry.

The now metal-deposited substrate can be cut to the desired shape. This can be accomplished by common punching/die cutting or blanking process for plastic or paper sheet.

Depending on the electro-deposit metal, a further plating of oxidation resistant metal, such as nickel or gold, can be plated on top of the exposed metal trace. A plating of oxidation resistant metal layer could be applied to the exposed metal trace before or after the undesired trace removing process. This is a commonly known practice in printed circuit board manufacturing.

It should be understood that while there have been described herein certain embodiments of our invention, it is not intended thereby to have the invention limited to the specific details given in view of the fact that it is susceptible to various modifications and changes which come within the spirit of the specification and the scope of the appended claims.

What is claimed is:

1. A method for producing a printed circuit board on a substrate comprising:
    a) printing a predetermined circuit pattern defined by connection traces onto the substrate using a conductive material;
    b) applying additional connection traces onto the substrate;
    c) depositing a metal layer onto the predetermined circuit pattern;
    d) applying an insulation layer over the metal layer deposited onto the predetermined circuit pattern, thereby encapsulating and securing the metal layer; and
    e) optionally removing any undesired connection traces from the predetermined circuit pattern.

2. A method of claim 1, further comprising cutting the substrate to a desired shape after the metal layer has been deposited onto the predetermined circuit pattern.

3. A method of claim 1, wherein the substrate comprises a rigid, semi-rigid, or flexible material.

4. A method of claim 1, wherein the substrate comprises a material selected from the group consisting of glass, paper, ceramics, or polymers.

5. A method of claim 1, wherein the conductive material is an ink or paste.

6. A method of claim 5, wherein the ink or paste is comprised of a resin binder containing a conductive material.

7. A method of claim 1, wherein the substrate is resistant to temperatures above about 150° C.

8. A method of claim 1, wherein the connection traces are applied by silk screening, off-set or pad printing with a printed circuit board trace.

9. A method of claim 1, wherein the metal layer comprises copper, nickel, silver, or gold.

10. A method of claim 1, wherein the metal layer deposited onto the predetermined circuit pattern has a thickness of about 0.001 mm to about 1 mm.

11. A method of claim 10, wherein the metal layer deposited onto the predetermined circuit pattern has a thickness of about 0.01 mm to about 0.1 mm.

12. A method of claim 10, wherein the metal layer deposited onto the predetermined circuit pattern has a thickness of about 0.01 mm to about 1 mm.

13. A method of claim 1, wherein prior to removal of undesired connection traces, an oxidation resistant metal layer is plated onto those portions of the metal layer that remain unencapsulated subsequent to application of the insulation layer.

14. A printed circuit board produced by a method of claim 1.

15. A method of claim 1, wherein the metal layer is deposited onto the predetermined circuit pattern by electroplating or electroforming a metal onto the substrate.

16. A method for producing a printed circuit comprising:
    (a) printing a circuit pattern defined in part by connection traces onto a substrate using a conductive ink or paste;
    (b) depositing a metal layer onto the circuit pattern;
    (c) applying an insulation layer over the metal layer deposited onto the circuit pattern, thereby encapsulating and securing the deposited metal layer; and
    (d) optionally removing unnecessary connection traces from the circuit pattern, wherein substantially all of the deposited metal layer adheres to the circuit pattern.

17. A method of claim 16, wherein the metal layer is deposited onto the printed circuit pattern by electroplating or electroforming a metal onto the substrate.

18. A method of claim 16, wherein the conductive ink or paste is comprised of a resin binder containing a conductive material.

19. A method for producing a printed circuit board on a substrate comprising:
    (a) printing a predetermined circuit pattern defined by connection traces onto the substrate using a conductive material, wherein the conductive material can air-dry onto the substrate;
    (b) applying additional connection traces onto the substrate;
    (c) depositing a metal layer onto the predetermined circuit pattern;
    (d) applying an insulation layer over the metal layer deposited onto the predetermined circuit pattern, thereby encapsulating and securing the metal layer; and
    (e) optionally removing any undesired connection traces from the predetermined circuit pattern;

wherein the conductive material can air-dry onto the substrate and the metal layer is deposited onto the substrate by a technique other than etching.

20. A method of claim 19, wherein the substrate comprises a material selected from the group consisting of glass, paper, ceramics, or polymers.

21. A method of claim 19, wherein the conductive material is an ink or paste.

22. A method of claim 21, wherein the conductive material comprises a conductive ink which is: (1) comprised of a binder and conductive metal powder; and (2) which dries onto the substrate at a temperature of around 150° C. or lower.

23. A method of claim 22, wherein the substrate is not a ceramic.

* * * * *